(12) United States Patent
Xia et al.

(10) Patent No.: US 11,616,213 B2
(45) Date of Patent: Mar. 28, 2023

(54) DISPLAY PANEL AND DISPLAY DEVICE HAVING LIGHT EXTRACTION STRUCTURE

(71) Applicant: SeeYA Optronics Co., Ltd., Shanghai (CN)

(72) Inventors: Wanwan Xia, Shanghai (CN); Liyuan Luo, Shanghai (CN); Dong Qian, Shanghai (CN)

(73) Assignee: SeeYA Optronics Co., Ltd., Shanghai (CN)

( * ) Notice: Subject to any disclaimer, the term of this patent is extended or adjusted under 35 U.S.C. 154(b) by 301 days.

(21) Appl. No.: 17/024,042

(22) Filed: Sep. 17, 2020

(65) Prior Publication Data

US 2021/0202916 A1 Jul. 1, 2021

(30) Foreign Application Priority Data

Dec. 25, 2019 (CN) .......................... 201911361227.8

(51) Int. Cl.
| | | |
|---|---|---|
| *H10K 50/858* | (2023.01) | |
| *H10K 59/38* | (2023.01) | |
| *H10K 50/84* | (2023.01) | |
| *G02B 27/01* | (2006.01) | |
| *H01L 51/52* | (2006.01) | |
| *H01L 27/32* | (2006.01) | |

(52) U.S. Cl.
CPC ........ *H01L 51/5275* (2013.01); *H01L 27/322* (2013.01); *H01L 51/5237* (2013.01); *G02B 27/0172* (2013.01)

(58) Field of Classification Search
CPC combination set(s) only.
See application file for complete search history.

(56) References Cited

U.S. PATENT DOCUMENTS

| | | | | |
|---|---|---|---|---|
| 2010/0194717 A1* | 8/2010 | Mori | ................... | H01L 51/5268 345/80 |
| 2019/0371866 A1* | 12/2019 | Kim | ...................... | H01L 27/322 |
| 2020/0083484 A1* | 3/2020 | Lee | ..................... | H01L 51/5256 |
| 2022/0158133 A1* | 5/2022 | Li | ....................... | H01L 51/5275 |

FOREIGN PATENT DOCUMENTS

| | | |
|---|---|---|
| CN | 102326447 A | 1/2012 |
| CN | 102550126 A | 7/2012 |
| CN | 108091678 A | 5/2018 |
| CN | 110379940 A | 10/2019 |
| JP | 2007280699 A | 10/2007 |

\* cited by examiner

*Primary Examiner* — Nduka E Ojeh
(74) *Attorney, Agent, or Firm* — W&G Law Group

(57) ABSTRACT

Provided are a display panel and a display device. The display panel includes a substrate, light-emitting units, a first organic layer, and light extraction structures located between the light-emitting units and the first organic layer. The first light extraction layer has a first central axis and is symmetrical about the first central axis, the second light extraction layer has a second central axis and is symmetrical about the second central axis, and the first central axis and the second central axis are perpendicular to the substrate. A surface of the second light extraction layer connecting the first light extraction layer is a first surface, a surface of the second light extraction layer facing away from the first light extraction layer is a second surface, and at least one of the first surface and the second surface comprises straight lines in a cross-section perpendicular to the substrate.

13 Claims, 10 Drawing Sheets

DISPLAY PANEL AND DISPLAY DEVICE HAVING LIGHT EXTRACTION STRUCTURE

CROSS-REFERENCE TO RELATED APPLICATIONS

The present application claims the benefit of priority to Chinese Patent Application No. 201911361227.8, filed on Dec. 25, 2019, the content of which is incorporated herein by reference in its entirety.

TECHNICAL FIELD

The present disclosure relates to display technology, and particularly, to a display panel and a display device.

BACKGROUND

Organic light-emitting diode (OLED) display is one type of self-luminous displays. Compared with liquid crystal display (LCD), the OLED display does not require a backlight, and thus the OLED display is thinner and lighter. Due to the advantages such as high brightness, low power consumption, wide viewing angle, high response speed, wide operating temperature range, the OLED displays are widely applied in the various fields of high-performance display.

In the related art, a conventional OLED display generally has such a structure that red pixel units, green pixel units, and blue pixel units, as well as a color film substrate of three primary colors of red, green, and blue are provided. However, the various pixel units in the current OLED displays have a relatively low light extraction efficiency.

SUMMARY

In a first aspect, an embodiment of the present disclosure provides a display panel including: a substrate; a plurality of light-emitting units located on a side of the substrate; a first organic layer located on a side of the plurality of light-emitting units facing away from the substrate; and a plurality of light extraction structures located between the plurality of light-emitting units and the first organic layer and in direct contact with the first organic layer. Each of the plurality of light extraction structures comprises a plurality of light extraction layers, refractive indexes of the plurality of light extraction layers gradually decrease in a direction facing towards the first organic layer, and a refractive index of any one of the plurality of light extraction layers is greater than a refractive index of the first organic layer. The plurality of light extraction layers at least comprises a first light extraction layer, and a second light extraction layer located between the first light extraction layer and the first organic layer, the first light extraction layer has a first central axis and is symmetrical about the first central axis, the second light extraction layer has a second central axis and is symmetrical about the second central axis, and the first central axis and the second central axis are perpendicular to the substrate. A contact surface between the first light extraction layer and the second light extraction layer is a first surface, a surface of the second light extraction layer facing away from the first light extraction layer is a second surface, and at least one of the first surface and the second surface comprises straight lines in a cross-section perpendicular to the substrate.

In the display panel provided by the embodiments of the present disclosure, the light extraction structures are provided between the light-emitting units and the first organic layer. Along a direction from the light-emitting unit towards the first organic layer, i.e., a light-emitting direction of the display panel, the refractive indexes of the light extraction layers in one light extraction structure gradually decrease, which avoids an abrupt change in the refractive indexes, thereby reducing a refractive index difference of two adjacent film layers. In this way, an amount of light reflected back to the display panel is reduced, while an amount of light emitted to the outside of the display panel is increased, and thus a light extraction efficiency of the display panel is enhanced. The plurality of light extraction layers in the light extraction structure can also converge the light multiple times, which further improves the light extraction efficiency of the display panel. It should be noted that, since a convex curved surface (such as a hemisphere) has a stronger ability of converging light in its central area and a weaker ability of converging light in its peripheral area, the light extraction efficiency of the display panel cannot be ideally improved by converging light with a hemispherical structure. In the embodiments of the present disclosure, at least one of the first surface and the second surface includes straight lines in the cross-section perpendicular to the substrate, which avoids merely using the convex curved surface, such that the light extraction structure has a better ability of converging light in its central area as well as its peripheral area. In this way, the light extraction efficiency of the display panel can be further enhanced.

DESCRIPTION OF EMBODIMENTS

The present disclosure will be further described in detail with reference to the drawings and embodiments. It can be understood that the specific embodiments described herein are only used to explain the present disclosure, rather than limiting the present disclosure. It should also be noted that, for the purpose of clearly describing, the drawings merely illustrate some but not all the structures related to the present disclosure.

Figure 1:
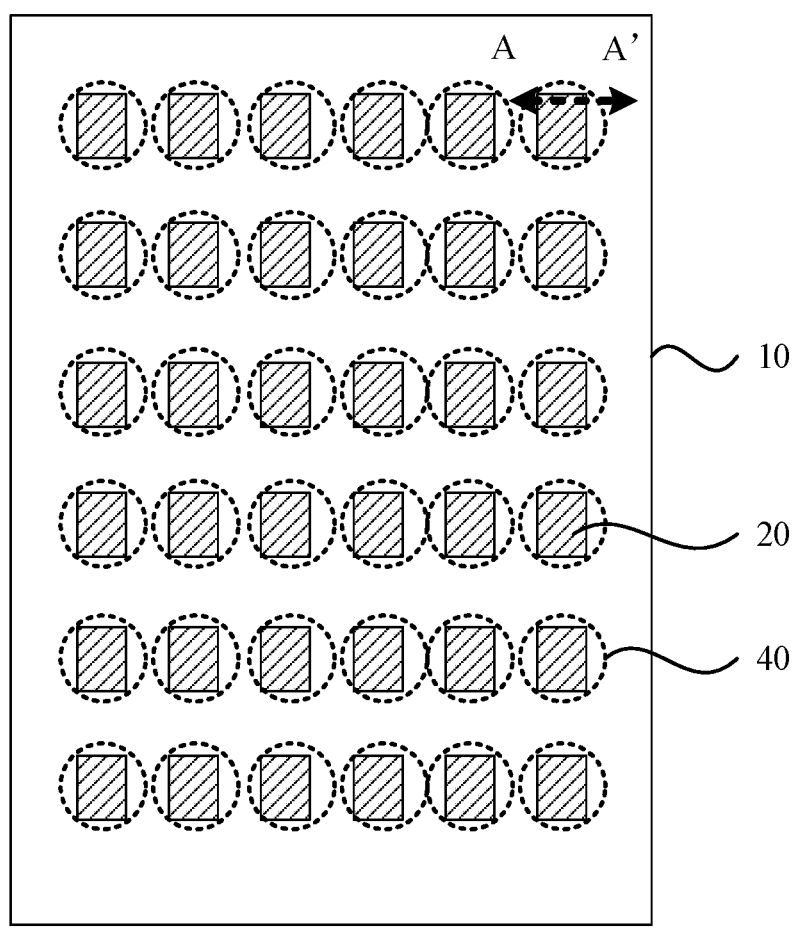
FIG. 1 is a schematic top view of a display panel provided by an embodiment of the present disclosure.
Figure 2:
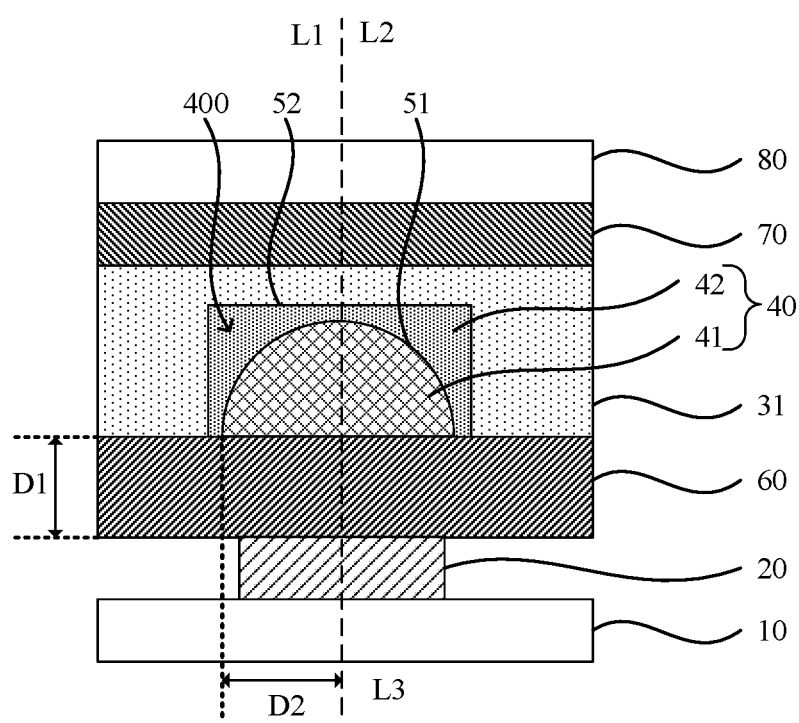
FIG. 2 is a structural schematic diagram of a cross-section along AA' in FIG. 1.
Figure 3:
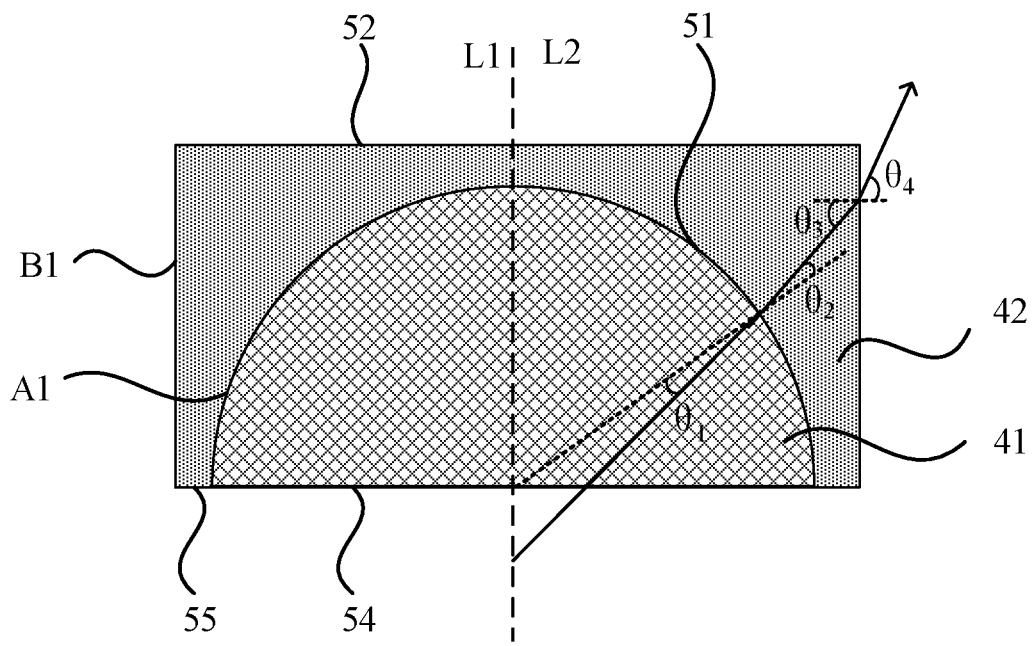
FIG. 3 is a schematic diagram of an optical path of a light extraction structure in FIG. 2.

FIG. 1 is a schematic top view of a display panel provided by an embodiment of the present disclosure, FIG. 2 is a structural schematic view of a cross-section along AA' in FIG. 1, and FIG. 3 is a schematic diagram of an optical path of a light extraction structure in FIG. 2. Referring to FIGS. 1, 2 and 3, the display panel includes a substrate 10, a plurality of light-emitting units 20, a first organic layer 31, and a plurality of light extraction structures 40. The plurality of light-emitting units 20 is located on one side of the substrate 10. The first organic layer 31 is located on a side of the plurality of light-emitting units 20 facing away from the substrate 10. The light extraction structures 40 are located between the light-emitting units 20 and the first organic layer 31 and are in direct contact with the first organic layer 31. The light extraction structure 40 includes a plurality of light extraction layers 400, and refractive indexes of the plurality of light extraction layers 400 gradually decrease in a direction facing towards the first organic layer 31, and the refractive index of any one of the plurality of light extraction layers 400 is greater than that of the first organic layer 31. The plurality of light extraction layers 400 at least includes a first light extraction layer 41 and a second light extraction layer 42. The second light extraction layer 42 is located between the first light extraction layer 41 and the first organic layer 31. The first light extraction layer 41 has a first central axis L1, and the first light extraction layer 41 is symmetric about the first central axis L1. The second light extraction layer 42 has a second central axis L2, and the second light extraction layer 42 is symmetric about the second central axis L2. The first central axis L1 and the second central axis L2 are perpendicular to the substrate 10. In an example, as shown in FIG. 1, the first central axis L1 and the second central axis L2 coincide with each other. However, the present disclosure is not limited to that and may be implemented in other manners, for example, the first central axis L1 may be parallel to but not coincident with the second central axis L2. A surface of the second light extraction layer 42 contacting the first light extraction layer 41 is a first surface 51, and a surface of the second light extraction layer 42 facing away from the first light extraction layer 41 is a second surface 52. At least one of the first surface 51 and the second surface 52 includes straight lines in a cross-section perpendicular to the substrate 10.

In the display panel provided by the embodiment of the present disclosure, the light extraction structures 40 are provided between the light-emitting units 20 and the first organic layer 31. Along a direction from the light-emitting unit 20 towards the first organic layer 31, i.e., a light-emitting direction of the display panel, the refractive indexes of the light extraction layers 400 in the light extraction structure 40 gradually decrease, which avoids an abrupt change in the refractive indexes, thereby reducing a refractive index difference of two adjacent film layers. In this way, an amount of light reflected back to the display panel is reduced, while an amount of light emitted to the outside of the display panel is increased, and thus a light extraction efficiency of the display panel is enhanced. The plurality of light extraction layers 400 in the light extraction structure 40 can also converge the light multiple times, which further improves the light extraction efficiency of the display panel. It should be noted that, since a convex curved surface (such as a hemisphere) has a stronger ability of converging light in its central area and a weaker ability of converging light in its peripheral area, the light extraction efficiency of the display panel cannot be ideally improved by converging light with a hemispherical structure. In the embodiment of the present disclosure, at least one of the first surface 51 and the second surface 52 includes straight lines in the cross-section perpendicular to the substrate 10, which avoids merely using the convex curved surface, such that the light extraction structure 40 has a better ability of converging light in its central area as well as its peripheral area. In this way, the light extraction efficiency of the display panel can be further enhanced.

Referring to FIGS. 1, 2 and 3, the display panel further includes a thin film encapsulation layer 60 located between the light-emitting units 20 and the light extraction structure 40. The light-emitting units 20 are located between the substrate 10 and the thin film encapsulation layer 60. The thin film encapsulation layer 60 covers the light-emitting units 20 to prevent the light-emitting units 20 from being corroded by moisture and oxygen. Moreover, the light extraction structures 40 are formed on a side of the thin film encapsulation layer 60 facing away from the light-emitting unit 20, such that the thin film encapsulation layer 60 can protect the light-emitting units 20 from being adversely affected during the process of forming the light extraction structures 40, thereby improving the light emission stability of the display panel. Further, due to the relatively great refractive index difference of the thin film encapsulation layer 60 and the refractive index of the first organic layer 31, the light extraction structures 40 are disposed between the thin film encapsulation layer 60 and the first organic layer 31. On the one hand, the refractive index difference of two adjacent film layers is reduced, thereby reducing the amount of the light reflected back to the display panel and increasing the amount of the light emitted outside the display panel. On the other hand, the refractive indexes of the plurality of light extraction layers 400 in the light extraction structure 40 can be selected in a broader range, i.e., the materials of the plurality of light extraction layers 400 in the light extraction structure 40 can be selected in a broader range. Furthermore, the light extraction structures 40 are formed on the thin film encapsulation layer 60 and are in contact with the thin film encapsulation layer 60. In other words, the light extraction structures 40 are formed on the substrate 10 to omit alignment and avoid misalignment.

Referring to FIGS. 1, 2 and 3, the refractive index of the thin film encapsulation layer 60 may be greater than or equal to the refractive index of the first light extraction layer 41. In the present embodiment, since the refractive index of the thin film encapsulation layer 60 is greater than or equal to the refractive index of the first light extraction layer 41, the refractive indexes gradually decrease from the thin film encapsulation layer 60, via the plurality of light extraction layers 400 in the light extraction structure 40 then to the first organic layer 31, forming a refractive index gradient, which is beneficial to emitting light from the display panel and further improves the light extraction efficiency of the display panel.

It can be understood that the refractive index of the thin film encapsulation layer 60 is preferably equal to the refractive index of the first light extraction layer 41. That is, light is not reflected at an interface between the thin film encapsulation layer 60 and the first light extraction layer 41, which further improves the light extraction efficiency of the display panel.

Referring to FIG. 1, FIG. 2 and FIG. 3, the display panel further includes a plurality of color filters 70. FIG. 2 merely illustrate one color filter 70 as an example. The plurality of color filters 70 is located on a side of the first organic layer 31 facing away from the substrate 10. The color filters 70 can improve color purity and color gamut of the display panel.

For example, as shown in FIG. 1, the plurality of light-emitting units 20 is arranged in an array, the plurality of light extraction structures 40 are arranged in an array, and the plurality of light-emitting units 20 corresponds to the plurality of light extraction structures 40 in one-to-one correspondence. An orthographic projection of each light-emitting unit 20 on the substrate 10 overlaps an orthographic projection of a corresponding light extraction structure 40 on the substrate 10. In other embodiments, one light-emitting unit 20 may correspond to multiple light extraction structures 40, or multiple light-emitting units 20 may correspond to one light extraction structure 40, which is specifically not limited in the present disclosure.

For example, as shown in FIG. 2, the display panel may further include a cover plate 80 located on a side of the color filters 70 facing away from the substrate 10. An organic layer or an optical adhesive may be provided between the cover plate 80 and the color filters 70.

Further referring to FIGS. 1, 2 and 3, in one light-emitting unit, any one of the plurality of light extraction layers 400 is symmetrical about the central axis L3 of the light-emitting unit. An extension of the central axis L3 of the light-emitting unit passes through a geometric center of the corresponding light-emitting unit 20 and the central axis L3 is perpendicular to the substrate 10. For example, as shown in FIG. 1, the central axis L3 of the light-emitting unit coincides with the first central axis L1 and the second central axis L2. In the present embodiment, in one light-emitting unit, any of the plurality of light extraction layers 400 is symmetrical about the central axis L3 of the light-emitting unit, and thus the light emitted by the light-emitting unit 20 can be symmetrically emitted to the outside of the display panel after passing through the light extraction structure 40, thereby improving the light extraction efficiency of the display panel.

Further referring to FIGS. 1, 2 and 3, a ratio of the refractive index of the first light extraction layer 41 to the refractive index of the first organic layer 31 is defined as a refractive index parameter, and the refractive index parameter is greater than or equal to 1.05 and smaller than or equal to 1.3. The refractive index parameter smaller than 1.05 is such small that the first light extraction layer 41 and the first organic layer 31 have similar refractive indexes. Since the first light extraction layer 41 has the largest the refractive index among all the light extraction layers 400 of the light extraction structure 40, the refractive index of any light extraction layer 400 in the light extraction structure 40 is similar to the refractive index of the first organic layer 31. Thus, the light extraction structure 40 cannot effectively converge the light. The refractive index parameter greater than 1.3 is such great that the refractive index of the first light extraction layer 41 significantly differs from the refractive index of the first organic layer 31, and the refractive index difference of any two adjacent light extraction layers 400 is too great, resulting in a relatively great reflectivity at the interface between any two adjacent light extraction layers 400. In the present embodiment, by limiting the refractive index parameter greater than or equal to 1.05 and smaller than or equal to 1.3, it is ensured that the light extraction structure 40 can effectively converge light and the reflectivity at the interface between any two adjacent light extraction layers 400 is reduced, thereby improving the light extraction efficiency of the display panel.

Further referring to FIGS. 1, 2 and 3, the orthographic projection of the light-emitting unit 20 on the substrate 10 is located within the orthographic projection of the light extraction structure 40 on the substrate 10. Along a direction facing towards the first organic layer 31, the light extraction layer 400 closer to the first organic layer 31 has an orthographic projection with a larger area on the substrate 10. In the embodiment of the present disclosure, the light extraction layer 400 farther from the light-emitting unit 20 has an orthographic projection with a larger area on the substrate 10. Along a direction facing away from the substrate 10, the plurality of light extraction layers 400 is sequentially stacked in such a manner that one light extraction layer 400 is covered by a next one light extraction layer 400. Thus, the light emitted by the light-emitting unit 20 can pass through any light extraction layer 400 of the light extraction structure 40, thereby improving the light extraction efficiency of the display panel.

Further referring to FIGS. 1, 2 and 3, the first surface 51 is a curved surface protruding towards the first organic layer 31. The second surface 52 includes straight lines in a cross-section perpendicular to the substrate 10. That is, in a cross-section taken along the direction perpendicular to the substrate 10, the second surface 52 includes straight lines. In the present embodiment, the first surface 51 is a convex curved surface, and the second surface 52 is not a convex curved surface.

Further referring to FIGS. 1, 2 and 3, an outer edge contour of the first light extraction layer 41 is a first hemisphere A1, and the first hemisphere A1 is hemispherical. An outer edge contour of the second light extraction layer 42 is a first cylinder B1, and the first cylinder B1 is cylindrical. It should be noted that, in the present disclosure, for the purpose of distinguishing, the hemisphere and the cylinder in the embodiments are described with different terms, for example, the hemisphere in the embodiment shown in FIG. 3 is described as the first hemisphere A1.

For example, as shown in FIGS. 1, 2 and 3, the first light extraction layer 41 further includes a fourth surface 54 facing towards the substrate 10, and the first light extraction layer 41 is defined by the fourth surface 54 and the first surface 51. The first hemisphere A1 includes the fourth surface 54 and the first surface 51. The second light extraction layer 42 may further include a fifth surface 55 facing towards the substrate 10. The second light extraction layer 42 is defined by the fifth surface 55, the second surface 52 and the first surface 51 together. The first cylinder B1 includes the fifth surface 55, the fourth surface 54, and the first surface 51.

For example, as shown in FIGS. 1, 2 and 3, an incidence angle of light projected onto the first surface 51 is $\theta 1$, and an emergence angle of the light projected onto the first surface 51 is $\theta 2$. Since the refractive index of the first light extraction layer 41 is greater than the refractive index of the second light extraction layer 42, the light will be transmitted from an optically denser medium to an optically thinner medium, and thus the emergence angle is greater than the incidence angle, i.e., $\theta_2 > \theta_1$. In this way, the light passing through the first light extraction layer 41 is deflected towards the first central axis L1, and the first light extraction layer 41 has a function of converging light. An incidence angle of light projected onto the second surface 52 is $\theta_3$, and an emergence angle of the light projected on the second surface 52 is $\theta_4$. Since the refractive index of the second light extraction layer 42 is greater than the refractive index of the first organic layer 31, the light will be transmitted from an optically denser medium to an optically thinner medium, and thus $\theta_4 > \theta_3$. In this way, the light passing through the second light extraction layer 42 is deflected towards the second central axis L2, i.e., the second light extraction layer 42 further converges the light and has a good ability of converging light in its peripheral area.

Further referring to FIGS. 1, 2 and 3, the display panel further includes a thin film encapsulation layer 60 located between the light-emitting units 20 and the light extraction structures 40. The light extraction structures 40 are located between the first organic layer 31 and the plurality of organic light-emitting units 20. The thin film encapsulation layer 60 has a thickness of D1, and the outer edge contour of the first light extraction layer 41 is the first hemisphere A1 having a radius of D2, where D1=D2. In order to explain the reasons of setting D1=D2 in the embodiments of the present disclosure, examples, in which D1>D2, D1=D2, and D1<D2, are provided for comparing the light convergence effects of the light extraction structures 40. When D2=2 μm, in examples of D1>D2, D1=2.4 μm, or D1=2.8 μm; and in example D1<D2, D1=0.8 μm, D1=1.2 μm or D1=1.8 μm.

Figure 4:
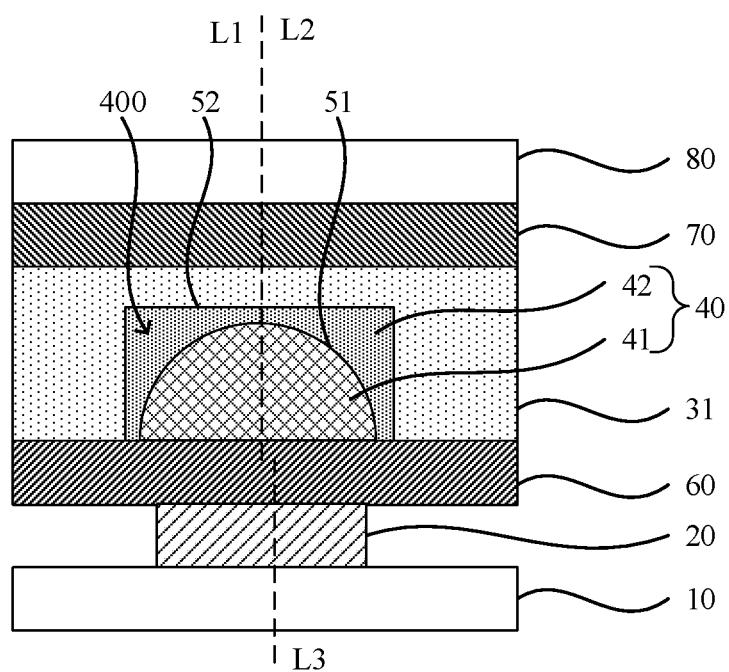
FIG. 4 is a schematic top view of another display panel provided by an embodiment of the present disclosure.

FIG. 4 is a schematic top view of another display panel provided by an embodiment of the present disclosure. Referring to FIG. 4, the first central axis L1 and the second central axis L2 coincide with each other, while the first central axis L1 is parallel to but not coincident with the central axis L3 of the light-emitting unit. In other embodiments, the first central axis L1 may be parallel to but not coincident with the second central axis L2, which is not limited in the present disclosure.

Figure 5:
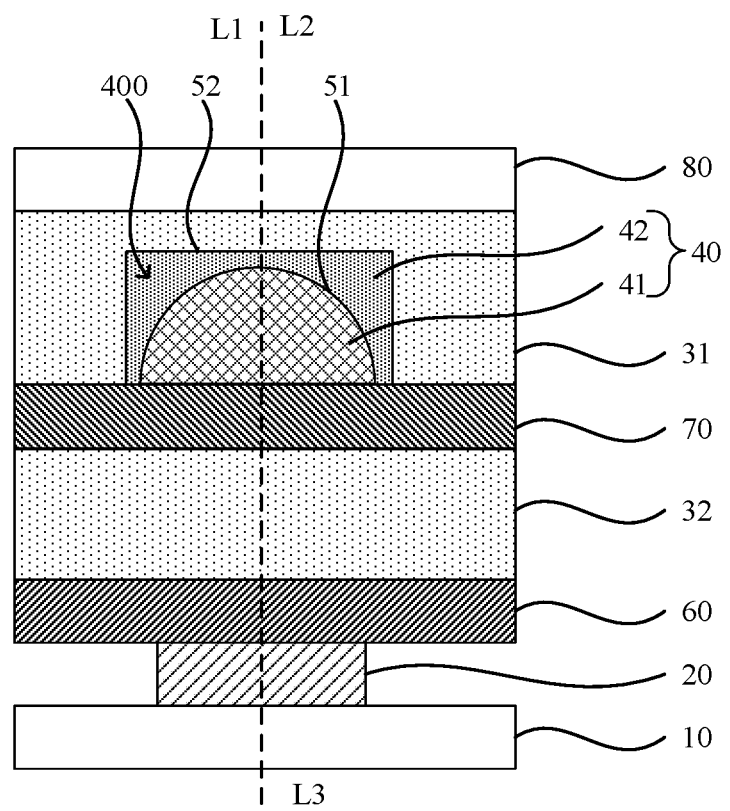
FIG. 5 is a schematic top view of yet another display panel provided by an embodiment of the present disclosure.

FIG. 5 is a schematic top view of another display panel provided by an embodiment of the present disclosure. Referring to FIG. 5, the display panel further includes a color filter 70 and a second organic layer 32. The display panel of this embodiment differs from that shown in FIG. 2 in that the color filter 70 is located between the light extraction structures 40 and the organic light-emitting unit 20. The second organic layer 32 is located between the color filter 70 and the organic light-emitting units 20.

Referring to FIG. 5, a refractive index of the color filter 70 is greater than or equal to the refractive index of the first light extraction layer 41. Due to the greater refractive index difference of the color filter 70 and the refractive index of the first organic layer 31, the light extraction structure 40 is disposed between the color filter 70 and the first organic layer 31. On the one hand, the refractive index difference of any two adjacent film layers is reduced, thereby reducing the amount of light reflected back to the display panel, and increasing the amount of light emitted to the outside of the display panel. On the other hand, the refractive indexes of the plurality of light extraction layers 400 in the light extraction structure 40 can be selected in a broader range, i.e., the materials of the plurality of light extraction layers 400 in the light extraction structure 40 can be selected a broader range.

TABLE 1

$\theta_1$ and $\theta_4$ at various thicknesses of the thin film encapsulation layer when D2 = 2 μm

| D1 = 0.8 | | D1 = 1.2 um | | D1 = 1.6 um | | D1 = 1.8 um | | D1 = 2 um | | D1 = 2.4 um | | D1 = 2.8 um | |
| --- | --- | --- | --- | --- | --- | --- | --- | --- | --- | --- | --- | --- | --- |
| θ1 | θ4 | θ1 | θ4 | θ1 | θ4 | θ1 | θ4 | θ1 | θ4 | θ1 | θ4 | θ1 | θ4 |
| 22 | 4.12 | 22 | 1.85 | 23 | 5.60 | 23 | 3.82 | 24 | 6.00 | 24 | 3.46 | 25 | 3.93 |
| 23 | 7.85 | 23 | 8.85 | 24 | 8.87 | 24 | 7.53 | 25 | 8.79 | 25 | 7.07 | 26 | 8.95 |
| 24 | 10.41 | 24 | 9.60 | 25 | 10.99 | 25 | 10.02 | 26 | 10.96 | 26 | 9.43 | 27 | 8.98 |
| 25 | 12.54 | 25 | 11.81 | 26 | 12.97 | 26 | 12.08 | 27 | 12.61 | 27 | 11.34 | 28 | 10.58 |
| 26 | 14.42 | 26 | 13.74 | 27 | 14.75 | 27 | 13.89 | 28 | 14.48 | 28 | 13.00 | 29 | 11.88 |
| 27 | 18.14 | 27 | 15.94 | 28 | 18.40 | 28 | 15.55 | 29 | 16.01 | 29 | 14.49 | 30 | 12.98 |
| 28 | 17.76 | 28 | 17.12 | 29 | 17.94 | 29 | 17.09 | 30 | 17.45 | 30 | 15.85 | 31 | 13.77 |
| 29 | 19.29 | 29 | 18.66 | 30 | 19.41 | 30 | 18.55 | 31 | 18.81 | 31 | 17.10 | 32 | 14.27 |

Table 1 corresponds to the light extraction structure 40 shown in FIG. 3, in which the second surface 52 is a cylindrical surface, and when the radius D2 of the first hemisphere A1 is 2 μm, the $\theta_1$ and $\theta_4$ at different thicknesses D1 of the thin film encapsulation layer 60 are shown in Table 1. It can be seen from Table 1 that, when D1=D2 or D1 is not significantly different from D2 (as ranges shown in Table 1), the incidence angle $\theta_1$ of the light incident on the first surface 51 is within a larger range (as ranges shown in Table 1), more light can be effectively emitted from the cylindrical surface, and the light extraction structure 40 has a good light converging effect; and when D1 is much greater than D2 (beyond the ranges shown in Table 1), the incidence angle $\theta_1$ of the light incident onto the first surface 51 is within a small range, and the light converging effect of the light extraction structure 40 is relatively poor.

For example, as shown in FIG. 3, the outer edge contour of the first light extraction layer 41 is a first hemisphere A1, and the outer edge contour of the second light extraction layer 42 is a first cylinder B1. The light extraction structure 40 shown in FIG. 3 is merely illustrative, and the present disclosure is not limited thereto. In other embodiments, the light extraction structure 40 may also have other structures, in which the first surface 51 includes a curved surface protruding towards the first organic layer 31. The second surface 52 includes straight lines in a cross-sectional view perpendicular to the substrate 10.

Figure 6:
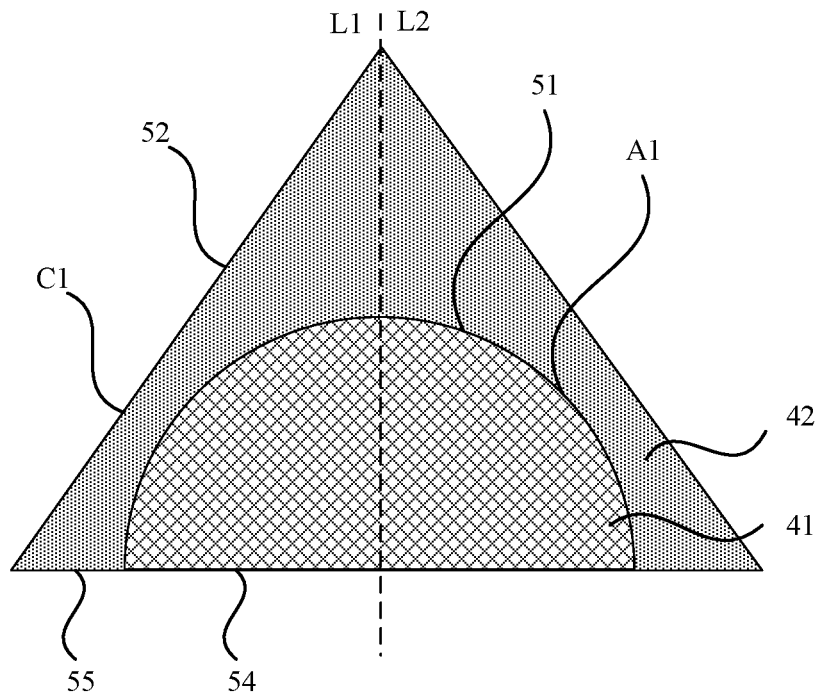
FIG. 6 is a structural schematic diagram of a cross-section of another light extraction structure provided by an embodiment of the present disclosure.

FIG. 6 is a schematic diagram of a cross-section of another light extraction structure provided by an embodiment of the present disclosure. Referring to FIG. 6, the first surface 51 includes a curved surface protruding towards the first organic layer 31, and the second surface 52 includes straight lines in the cross-section perpendicular to the substrate 10. The outer edge contour of the first light extraction layer 41 is a first hemisphere A1, and the outer edge contour of the second light extraction layer 42 is a first cone C1, where the first cone C1 is a conical.

For example, as shown in FIG. 6, the first hemisphere A1 includes a first surface 51 and a fourth surface 54. The first cone C1 includes a second surface 52, the fourth surface 54, and a fifth surface 55.

In addition, it should be noted that in the field of optical technology, hemispheres are often used to converge light, but cones are rarely used. In the field of display technology, especially in head-mounted display technology, cones have not been used to converge light. In the embodiment of the present disclosure, a cone is adopted to converge light is based on the following considerations. The cone includes a straight line in the cross-section perpendicular to the substrate 10, which can improve the ability of converging light of the peripheral area of the light extraction structure 40. The manufacturing process of the cone is relatively simple, and the cone can be manufactured though less difficult conventional processes such as exposure development and imprinting. As the cone surface has a certain inclination, the cone itself has good ability of converging light. Referring to FIG. 6, in the cross-section perpendicular to the substrate 10, the second surface 52 as represented by two inclined straight lines. Since the two inclined straight lines are inclined towards the second central axis L2, the light exiting from the second surface 52 are further deflected towards the second central axis L2, which increases the light converging effect of the second light extraction layer 42.

Figure 7:
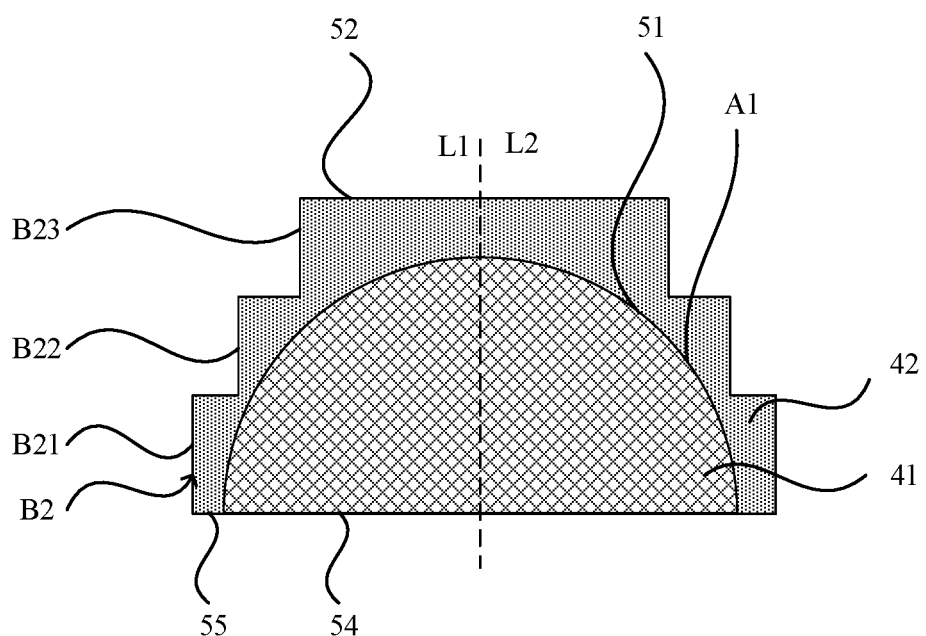
FIG. 7 is a structural schematic diagram of a cross-section of yet another light extraction structure provided by an embodiment of the present disclosure.

FIG. 7 is a schematic diagram of a cross-section of another light extraction structure provided by an embodiment of the present disclosure. Referring to FIG. 7, the first surface 51 includes a curved surface protruding towards the first organic layer 31. The second surface 52 includes straight lines in a cross-section perpendicular to the substrate 10. The outer edge contour of the first light extraction layer 41 is a first hemisphere A1, and the outer edge contour of the second light extraction layer 42 includes at least two second cylinders B2. The at least two second cylinders B2 are stacked in the direction perpendicular to the substrate 10, and the radiuses of the at least two second cylinders B2 gradually decrease along a direction facing towards the first organic layer 31. Each second cylinder B2 is cylindrical.

For example, as shown in FIG. 7, the at least two second cylinders B2 include a first sub-cylinder B21, a second sub-cylinder B22, and a third sub-cylinder B23 that are stacked in the direction perpendicular to the substrate 10. The first sub-cylinder B21 has a larger radius than the second sub-cylinder B22, and the second sub-cylinder B22 has a larger radius than the third sub-cylinder B23. The second surface 52 includes side surfaces of the first sub-cylinder B21, the second sub-cylinder B22 and the third sub-cylinder B23, and a top surface of the third sub-cylinder B23.

For example, as shown in FIG. 7, cylindrical surfaces of the second cylinders B2 are shown as straight lines parallel to the first central axis L1 in a cross-section perpendicular to the substrate 10, and the peripheral area of the light extraction structure 40 has a good ability of converging light.

Figure 8:
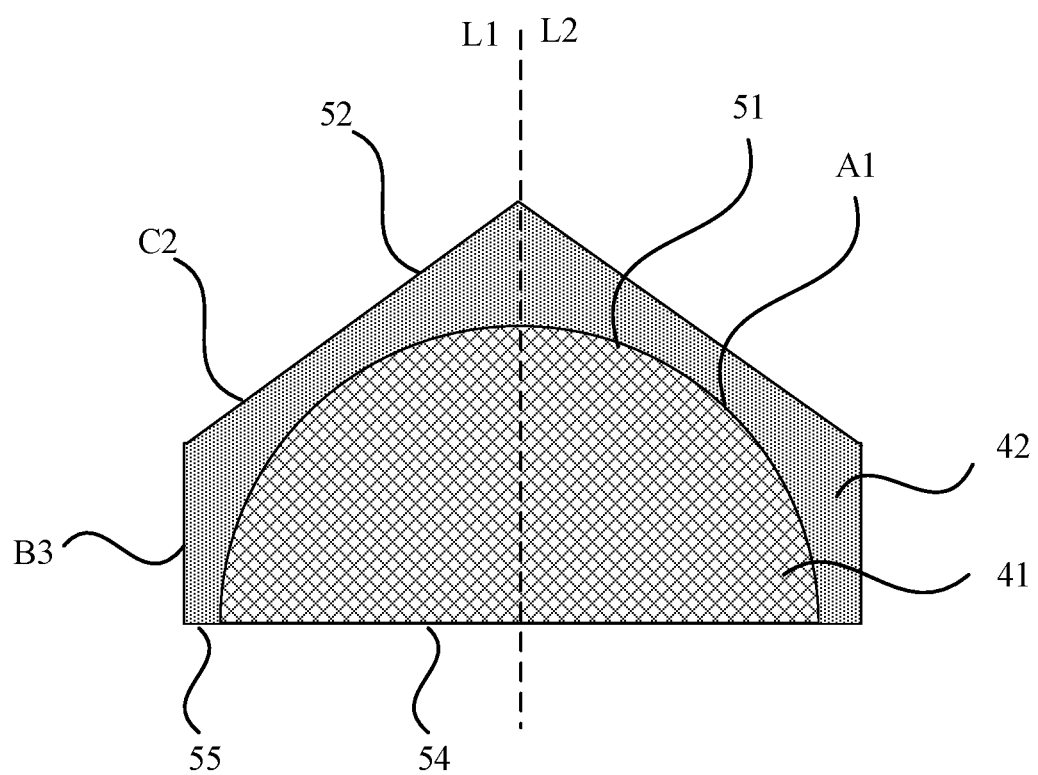
FIG. 8 is a structural schematic diagram of a cross-section of yet another light extraction structure provided by an embodiment of the present disclosure.

FIG. 8 is a schematic diagram of a cross-section of another light extraction structure provided by an embodiment of the present disclosure. Referring to FIG. 8, the first surface 51 includes a curved surface protruding towards the first organic layer 31. The second surface 52 includes straight lines in a cross-section perpendicular to the substrate 10. The outer edge contour of the first light extraction layer 41 is a first hemisphere A1, and the outer edge contour of the second light extraction layer 42 includes a third cylinder B3, and a second cone C2 located between the third cylinder B3 and the first organic layer 31. The third cylinder B3 is cylindrical, and the second conical C2 is conical.

For example, as shown in FIG. 8, the second surface 52 includes side surfaces of the third cylinder B3 and side surfaces of the second cone C2.

For example, in the embodiment as shown in FIG. 8, in which the outer edge contour of the second light extraction layer 42 includes the third cylinder B3 and the second cone C2, the second cone C2 is used due to its advantages such as low process difficulty and strong ability of converging light, which will not be repeated here. Further, since the second cone C2 is located between the third cylinder B3 and the first organic layer 31 and formed on the third cylinder B3, then a slope of the second cone C2 can be reduced, and a distance between a tip of the small second cone C2 facing away from the substrate 10 and the fifth surface 55 is reduced. That is, a height of the light extraction structure 400 in the direction perpendicular to the substrate 10 is reduced, thereby reducing the thickness of the display panel. In FIGS. 3 and 6-8, the first surface 51 includes the curved surface protruding towards the first organic layer 31, and the second surface 52 includes straight lines in the cross-section perpendicular to the substrate 10. In other embodiment, the first surface 51 may include straight lines in the cross-section perpendicular to the substrate 10, and the second surface 52 includes a curved surface protruding towards the first organic layer 31. In other embodiment, in the cross-section perpendicular to the substrate 10, the first surface 51 includes straight lines and the second surface 52 includes straight lines.

Figure 9:
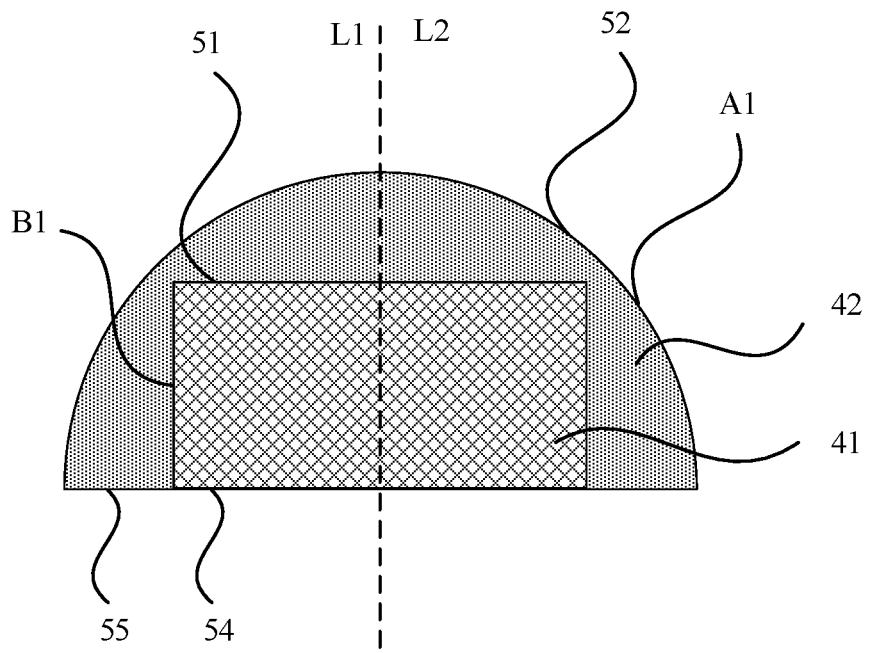
FIG. 9 is a structural schematic diagram of a cross-section of yet another light extraction structure provided by an embodiment of the present disclosure.

FIG. 9 is a schematic diagram of a cross-section of another light extraction structure provided by an embodiment of the present disclosure. Referring to FIG. 9, the first surface includes straight lines in a cross-section perpendicular to the substrate 10. The second surface 52 includes a curved surface protruding towards the first organic layer 31. That is, in a cross-sectional view taken along the direction perpendicular to the substrate 10, the first surface 51 includes straight lines. In the present embodiment, the first surface 51 is not a convex curved surface, and the second surface 52 is a convex curved surface.

Further referring to FIG. 9, the outer edge contour of the first light extraction layer 41 is a first cylinder B1, and the outer edge contour of the second light extraction layer 42 is a first hemisphere A1.

For example, as shown in FIG. 9, the first cylinder B1 includes a first surface 51 and a fourth surface 54, and the first hemisphere A1 includes a second surface 52, the fourth surface 54 and a fifth surface 55.

Figure 10:
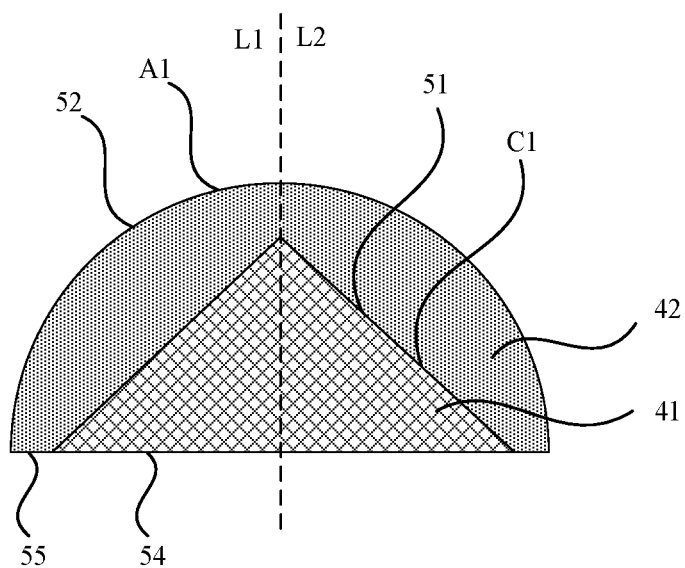
FIG. 10 is a structural schematic diagram of a cross-section of yet another light extraction structure provided by an embodiment of the present disclosure.

FIG. 10 is a schematic diagram of a cross-section of another light extraction structure provided by an embodiment of the present disclosure. Referring to FIG. 10, the first surface 51 includes straight lines in a cross-section perpendicular to the substrate 10, and the second surface 52 includes a curved surface protruding towards the first organic layer 31. The outer edge contour of the first light extraction layer 41 is a first cone C1, and the outer edge contour of the second light extraction layer 42 is a first hemisphere A1.

For example, as shown in FIG. 10, the first cone C1 includes a first surface 51 and a fourth surface 54. The first hemisphere A1 includes a second surface 52, the fourth surface 54, and a fifth surface 55.

Figure 11:
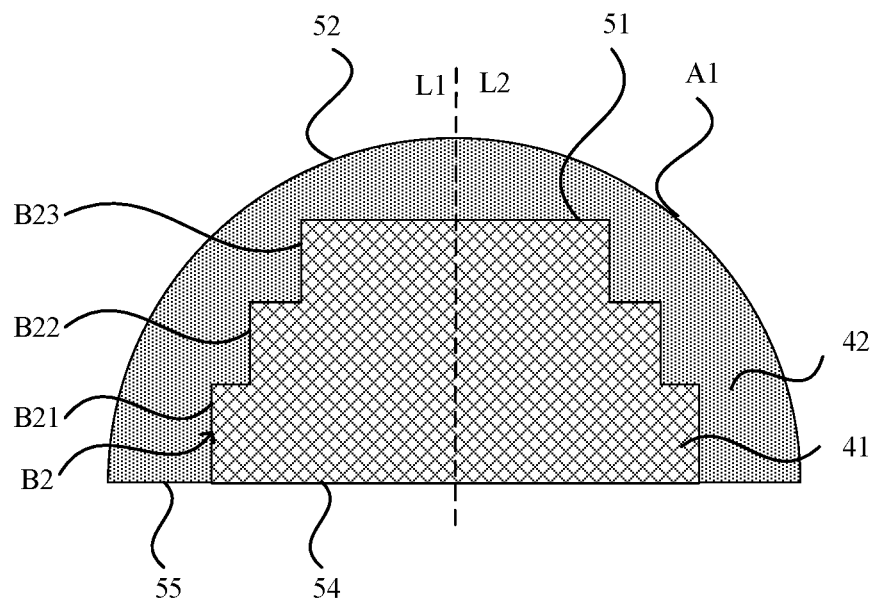
FIG. 11 is a structural schematic diagram of a cross-section of yet another light extraction structure provided by an embodiment of the present disclosure.

FIG. 11 is a schematic diagram of a cross-section of another light extraction structure provided by an embodiment of the present disclosure. Referring to FIG. 11, the first surface 51 includes straight lines in the cross-section perpendicular to the substrate 10, and the second surface 52 includes a curved surface protruding towards the first organic layer 31. The outer edge contour of the first light extraction layer 41 includes at least two second cylinders B2 that are stacked in the direction perpendicular to the substrate 10. Radiuses of the at least two second cylinders B2 gradually decrease in a direction facing towards the first organic layer 31, and the outer edge contour of the second light extraction layer 42 is a first hemisphere A1.

For example, as shown in FIG. 11, the first surface 51 includes side surfaces of a first sub-cylinder B21, the second sub-cylinder B22, and the third sub-cylinder B23, and a top surface of the third sub-cylinder B23.

Figure 12:
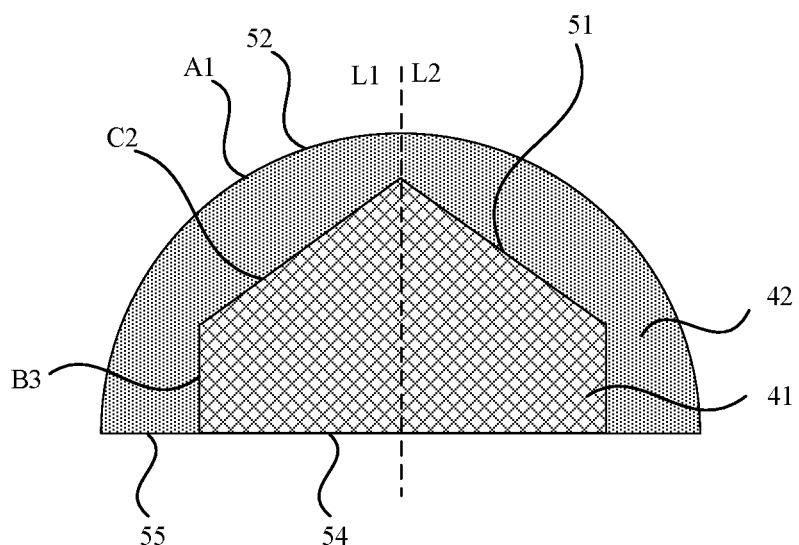
FIG. 12 is a structural schematic diagram of a cross-section of yet another light extraction structure provided by an embodiment of the present disclosure.

FIG. 12 is a schematic diagram of a cross-section of another light extraction structure provided by an embodiment of the present disclosure. Referring to FIG. 12, the first surface 51 includes straight lines in a cross-section perpendicular to the substrate 10, and the second surface 52 includes a curved surface protruding towards the first organic layer 31. The outer edge contour of the first light extraction layer 41 includes a third cylinder B3 and a second cone C2, the second cone C2 is located between the third cylinder B3 and the first organic layer 31, and the outer edge contour of the second light extraction layer 42 is a first hemisphere A1.

For example, as shown in 12, the first surface 51 includes side surfaces of the third cylinder B3 and side surfaces of the second cone C2.

Figure 13:
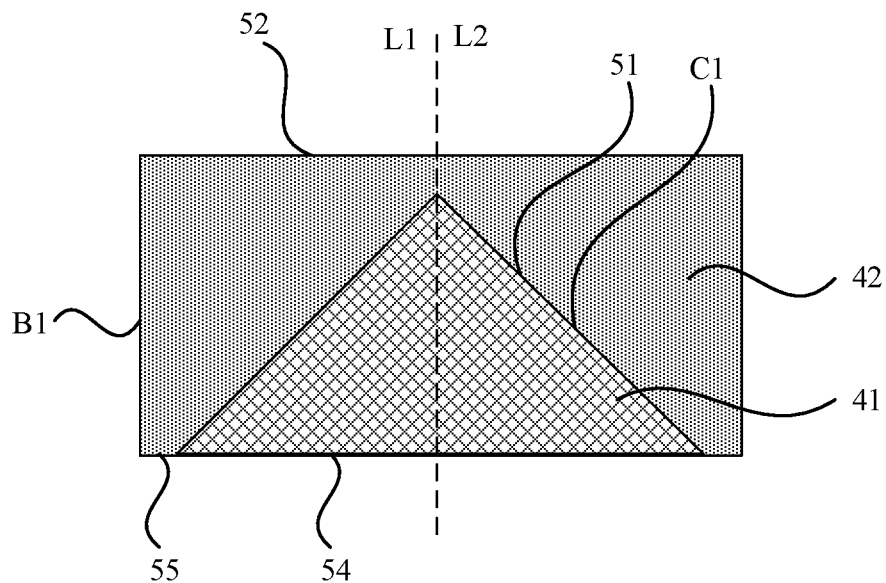
FIG. 13 is a structural schematic diagram of a cross-section of yet another light extraction structure provided by an embodiment of the present disclosure.

FIG. 13 is a schematic diagram of a cross-section of another light extraction structure provided by an embodiment of the present disclosure. Referring to FIG. 13, in a cross-section perpendicular to the substrate 10, the first surface 51 includes straight lines and the second surface 52 includes straight lines. The outer edge contour of the first light extraction layer 41 is a first cone C1, and the outer edge contour of the second light extraction layer 42 is a first cylinder B1.

Figure 14:
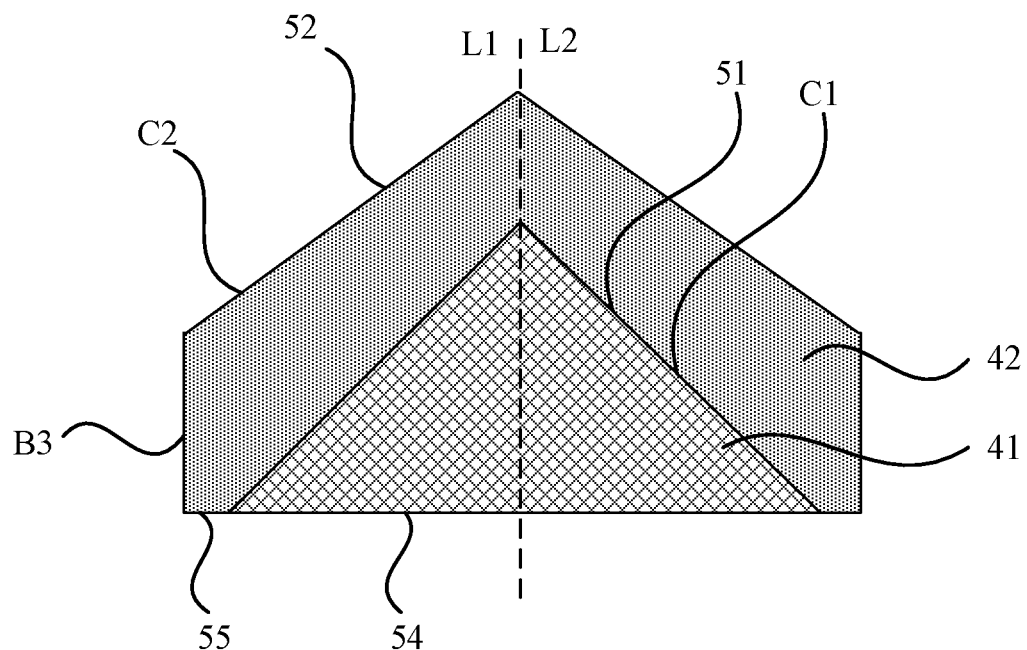
FIG. 14 is a structural schematic diagram of a cross-section of yet another light extraction structure provided by an embodiment of the present disclosure.

FIG. 14 is a schematic diagram of a cross-section of another light extraction structure provided by an embodiment of the present disclosure. Referring to FIG. 14, in a cross-section perpendicular to the substrate 10, the first surface 51 includes straight lines, and the second surface 52 includes straight lines. The outer edge contour of the first light extraction layer 41 is a first cone C1, and the outer edge contour of the second light extraction layer 42 includes a third cylinder B3 and a second cone C2.

Figure 15:
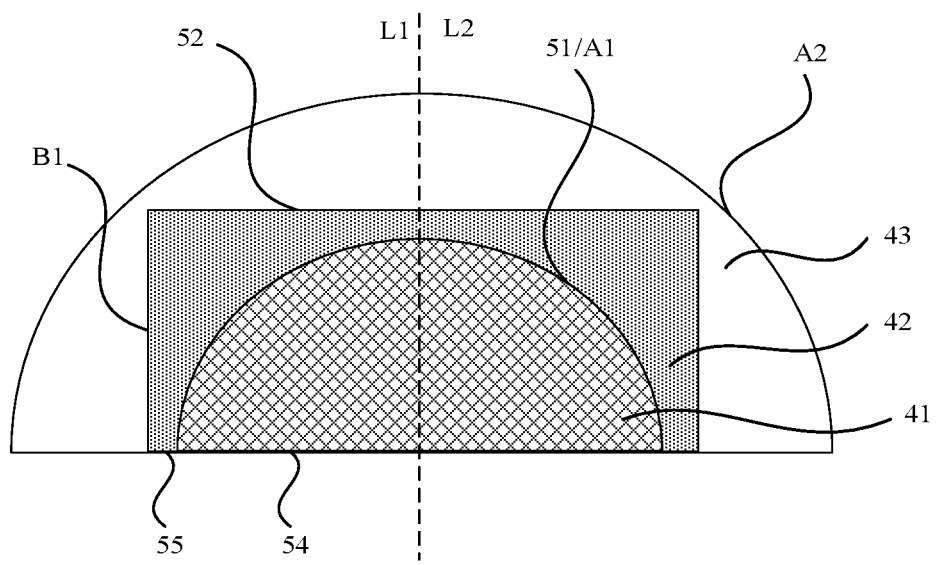
FIG. 15 is a structural schematic diagram of a cross-section of yet another light extraction structure provided by an embodiment of the present disclosure.

FIG. 15 is a schematic diagram of a cross-section of another light extraction structure provided by an embodiment of the present disclosure. Referring to FIG. 15, the first surface 51 includes a curved surface protruding towards the first organic layer 31, and the second surface 52 includes straight lines in a cross-section perpendicular to the substrate 10. The light extraction structure 40 includes a first light extraction layer 41, a second light extraction layer 42, and a third light extraction layer 43. The second light extraction layer 42 covers the first light extraction layer 41, and the third light extraction layer 43 covers the second light extraction layer 42. A refractive index of the second light extraction layer 42 is greater than that of the first light extraction layer 41, and a refractive index of the third light extraction layer 43 is greater than that of the second light extraction layer 42.

For example, as shown in FIG. 15, an outer edge contour of the first light extraction layer 41 is a first hemisphere A1, an outer edge contour of the second light extraction layer 42 is a first cylinder B1, and an outer edge contour of the third light extraction layer 43 is a second hemisphere A2.

Figure 16:
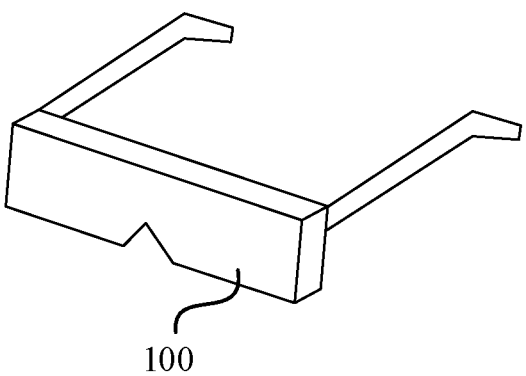
FIG. 16 is a structural schematic diagram of a display device provided by an embodiment of the present disclosure.

An embodiment of the present disclosure further provides a display device. FIG. 16 is a structural schematic diagram of a display device provided by an embodiment of the present disclosure. Referring to FIG. 16, the display device includes the display panels 100 according to any of the above embodiments of the present disclosure. The display device may be a head-mounted display. In other embodiments, the display device may be a mobile phone, a tablet computer, and a smart wearable device, etc.

The above are only the preferred embodiments and technical principles of the present disclosure. Those skilled in the art will understand that the present disclosure is not limited to the specific embodiments described herein, and they can make various changes, modifications, combinations and substitutions without departing from the protection scope of the present disclosure. Therefore, although the present disclosure is described in detail with the above embodiments, the present disclosure is not limited to these embodiments, and may include other equivalent embodiments without departing from the concept of the present disclosure. The scope of the present disclosure is defined by the scope of the appended claims.

What is claimed is:

1. A display panel, comprising:

a substrate;

a plurality of light-emitting units located on a side of the substrate;

a first organic layer located on a side of the plurality of light-emitting units facing away from the substrate; and a plurality of light extraction structures located between the plurality of light-emitting units and the first organic layer and in direct contact with the first organic layer, wherein each of the plurality of light extraction structures comprises a plurality of light extraction layers, refractive indexes of the plurality of light extraction layers gradually decrease in a direction facing towards the first organic layer, and a refractive index of any one of the plurality of light extraction layers is greater than a refractive index of the first organic layer, wherein the plurality of light extraction layers at least comprises a first light extraction layer, and a second light extraction layer located between the first light extraction layer and the first organic layer, the first light extraction layer has a first central axis and is symmetrical about the first central axis, the second light extraction layer has a second central axis and is symmetrical about the second central axis, and the first central axis and the second central axis are perpendicular to the substrate, and wherein a surface of the second light extraction layer contacting the first light extraction layer is a first surface, a surface of the second light extraction layer facing away from the first light extraction layer is a second surface, and at least one of the first surface and the second surface comprises straight line in a cross-section perpendicular to the substrate, wherein the plurality of light extraction layers do not contact each other, and are spaced from one another by the first organic layer.

2. The display panel according to claim 1, further comprising a thin film encapsulation layer located between the plurality of light-emitting units and the plurality of light extraction structures,
wherein a refractive index of the thin film encapsulation layer is greater than or equal to a refractive index of the first light extraction layer.

3. The display panel according to claim 1, further comprising:
a plurality of color filters, wherein the plurality of color filters is located on a side of the first organic layer facing away from the substrate, or the plurality of color filters is located between the plurality of light extraction structures and the plurality of organic light-emitting units; and
a second organic layer located between the plurality of color filters and the plurality of organic light-emitting units.

4. The display panel according to claim 3, wherein a refractive index of each of the plurality of color filters is greater than or equal to a refractive index of the first light extraction layer.

5. The display panel according to claim 1, wherein each of the plurality of light-emitting units has a central axis perpendicular to the substrate and passing along a geometric center of the light-emitting unit, any one light extraction structure of one corresponding light extraction structure above the light-emitting unit is symmetrical about a central axis of the light-emitting unit.

6. The display panel according to claim 1, wherein a ratio of a refractive index of the first light extraction layer to the refractive index of the first organic layer is a refractive index parameter, and the refractive index parameter is greater than or equal to 1.05 and smaller than or equal to 1.3.

7. The display panel of claim 1, wherein an orthographic projection of each of the plurality of light-emitting units on the substrate is located within an orthographic projection of a corresponding light extraction structure of the plurality of light extraction structures on the substrate; and the plurality of light extraction layers arranged along the direction facing towards the first organic layer has increasingly large orthographic projections on the substrate.

8. The display panel according to claim 1, wherein the first surface comprises a curved surface protruding towards the first organic layer, and the second surface comprises the straight lines in the cross-section perpendicular to the substrate.

9. The display panel of claim 8, wherein an outer edge contour of the first light extraction layer is a first hemisphere, and an outer edge contour of the second light extraction layer is a first cylinder;
wherein the display panel further comprises a thin film encapsulation layer located between the plurality of light-emitting units and plurality of light extraction structures,
wherein the plurality of light extraction structures is located between the first organic layer and the plurality of organic light-emitting units, and a thickness of the thin film encapsulation layer is equal to a radius of the first hemisphere.

10. The display panel according to claim 9, wherein an outer edge contour of the first light extraction layer is a first hemisphere, and an outer edge contour of the second light extraction layer is a first cone.

11. The display panel according to claim 9, wherein an outer edge contour of the first light extraction layer is a first hemisphere, and an outer edge contour of the second light extraction layer comprises at least two second cylinders that are stacked in a direction perpendicular to the substrate, and
wherein radiuses of the at least two second cylinders gradually decrease in the direction facing towards the first organic layer.

12. The display panel according to claim 9, wherein an outer edge contour of the first light extraction layer is a first hemisphere, and an outer edge contour of the second light extraction layer comprises a third cylinder, and a second cone located between the third cylinder and the first organic layer.

13. The display panel according to claim 1, wherein the first surface comprises the straight lines in the cross-section perpendicular to the substrate, and the second surface comprises a curved surface protruding towards the first organic layer.

* * * * *